United States Patent [19]

Brommer et al.

[11] Patent Number: 5,389,943
[45] Date of Patent: Feb. 14, 1995

[54] FILTER UTILIZING A FREQUENCY SELECTIVE NON-CONDUCTIVE DIELECTRIC STRUCTURE

[75] Inventors: Karl Brommer, Hampton Falls; Henry Mullaney, Amherst, both of N.H.; Robert Meade, Somerville, Mass.; Andrew Rappe, Emeryville, Calif.; John Joannopoulos, Belmont, Mass.

[73] Assignees: Lockheed Sanders, Inc., Nashua, N.H.; Massachusetts Institute of Technology, Cambridge, Mass.

[21] Appl. No.: 920,001

[22] Filed: Jul. 27, 1992

Related U.S. Application Data

[63] Continuation-in-part of Ser. No. 656,812, Feb. 15, 1991, Pat. No. 5,187,461.

[51] Int. Cl.$^6$ .................. H01Q 15/00; H01P 1/201
[52] U.S. Cl. ........................ 343/909; 343/787; 333/202; 333/235
[58] Field of Search .................... 333/202, 219.1, 235; 343/909, 910, 911 R, 754, 787

[56] References Cited

U.S. PATENT DOCUMENTS

| | | | |
|---|---|---|---|
| 3,465,361 | 2/1969 | Lode | 343/911 R |
| 3,698,001 | 10/1972 | Koyama et al. | 333/185 X |
| 3,789,404 | 1/1974 | Munk | 343/872 X |
| 3,924,239 | 12/1975 | Fletcher et al. | 343/909 |
| 4,125,841 | 11/1978 | Munk | 343/909 |
| 5,187,461 | 2/1993 | Brommer et al. | 333/219.1 |

FOREIGN PATENT DOCUMENTS

| | | | |
|---|---|---|---|
| 159109 | 10/1982 | Japan | 333/235 |
| 2156164 | 10/1985 | United Kingdom | 333/202 |

OTHER PUBLICATIONS

Kelleher, K. S. and Goatley G.; "Dielectric Lens for Microwaves"; *Electronics;* Aug. 1955; pp. 142–145.

Yablonovitch, Eli, "Inhibited Spontaneoud Emission in Solid-State Physics and Electronics", *Physical Review Letters,* 58:20:2059–2062, (May 1987).

Mongia, R. K., "Resonant Frequency of Cylindrical Dielectric Resonator Placed in an MIC Environment", *IEEE Transaction on Microwave Theory and Techniques,* 38:6:802–804, (Jun. 1990).

Kobayashi, Yoshio, et al., "Influence of Conductor Shields on the Q-Factors Of A TE$_O$ Dielectric Resonator", *MIT-S Digest,* pp. 281–284, (1985).

Yablonovitch, E. et al., "Photonic Band Structure: The Face-Centered-Cubic Gas *Physical Review Letters",* 63:18: 1950–1953, (Oct. 1989).

Leung, K. M. et al., "Full Vector Wave Calculation of Photonic Band Structure in Face-Centered-Cubic Dielectric Media"*Physical Review Letters,* 65:21:2646–2649, (Nov. 1990).

Ho, K. M. et al., "Existence of a Photonic Gap in Periodic Dielectric Structures *Physical Review Letters",* 65:25:3152–3155, (Dec. 1990).

Zhang, Ze et al., "Electromagnetic Wave Propagation in Periodic Structures: Bloch Wave Solution of Maxwell's Equations", *Physical Review Letters,* 65:21:2650–2653, (Nov. 1990).

(List continued on next page.)

*Primary Examiner*—Benny T. Lee
*Attorney, Agent, or Firm*—Hamilton, Brook, Smith & Reynolds

[57] ABSTRACT

A filter utilizes a frequency selective, non-conductive, dielectric structure for filtering electromagnetic energy in the millimeter to far infrared frequency bands. The filter includes a non-conductive, high-dielectric, background material positioned to receive incident electromagnetic energy. A lattice structure comprised of a plurality of elongated elements formed of a non-conductive, high-dielectric material are disposed in a two-dimensional, periodic arrangement in the background material. The elements extend in parallel to one another through the background material for providing a range of frequencies over a band gap in which incident electromagnetic energy within the frequency range of the band gap is substantially prevented from propagating through the lattice structure. The dielectric structure can be adapted to operate as a band stop filter or a low pass filter.

39 Claims, 8 Drawing Sheets

OTHER PUBLICATIONS

Ho, K. M. et al., "Comment on 'Theory of Photon Bands in Three-Dimensional Periodic Dielectric Structures", *Physical Review Letters*, 66:3:393 (Jan. 1991).

Satpathy, S., et al., "Comment on 'Theory of Photon Bands in Three-Dimensional Periodic Dielectric Structures'", *Physical Review Letters*, 66:3:394, (Jan. 199).

Navarro, A. et al., "Study of $TE_0$ and $TM_0$ Modes in Dielectric Resonators by a Finite Difference Time-Domain Method Coupled with the Discrete Fourier Transform", *IEEE Transactions on Microwave Theory and Tehnique* 39:1:14-17, (Jan. 1991).

Weisshaar, Andreas, et al., "Perturbation Analysis and Modeling of Curved Microstrip Bends", *IEEE Transactions on Microwave Theory and Techniques*, 38:10:1449-1454, (Oct. 1980).

Kato, Haruhiko et al., "A 30 GHz MMIC Receiver for Satellite Transponders", *IEEE Transactions on Microwave Theory and Techniques*, 38:7:896-902, (Jul. 199).

Yablonovitch, E. et al., Abstracts: "Photonic Band Structure: The Face-Center Cubic Case Employing Non-Spherical Atoms", 1-16, (Unpublished).

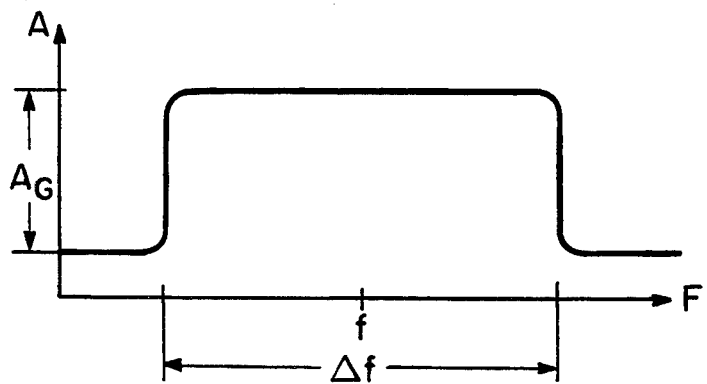
FIG. 4
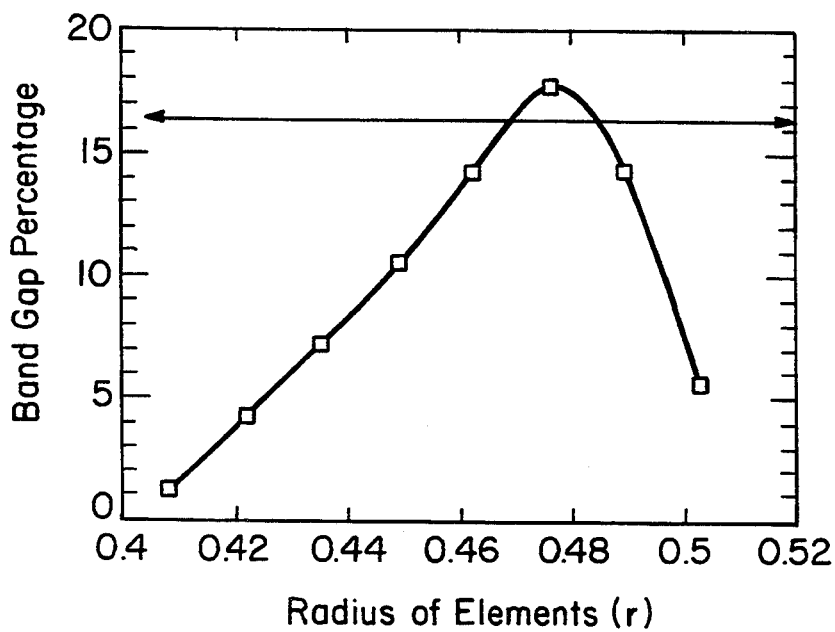
FIG. 5
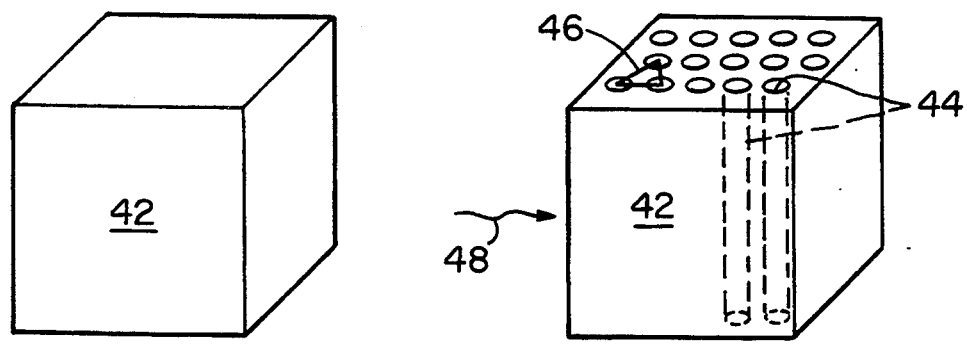
FIG. 7A
FIG. 7B

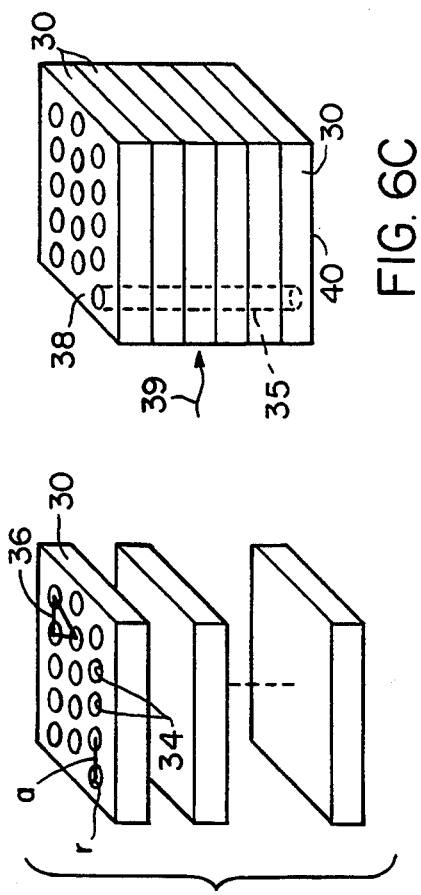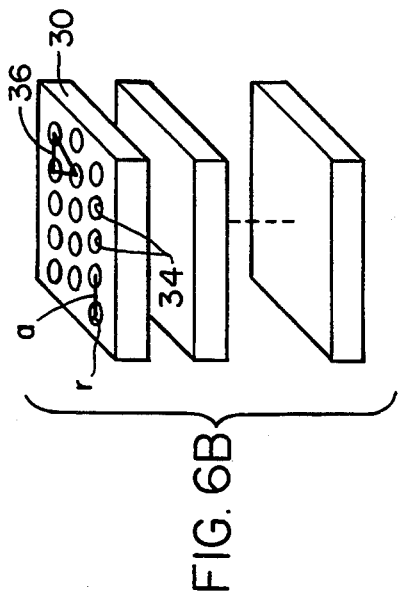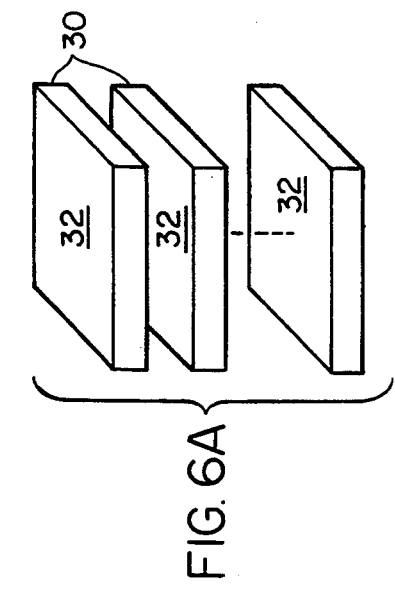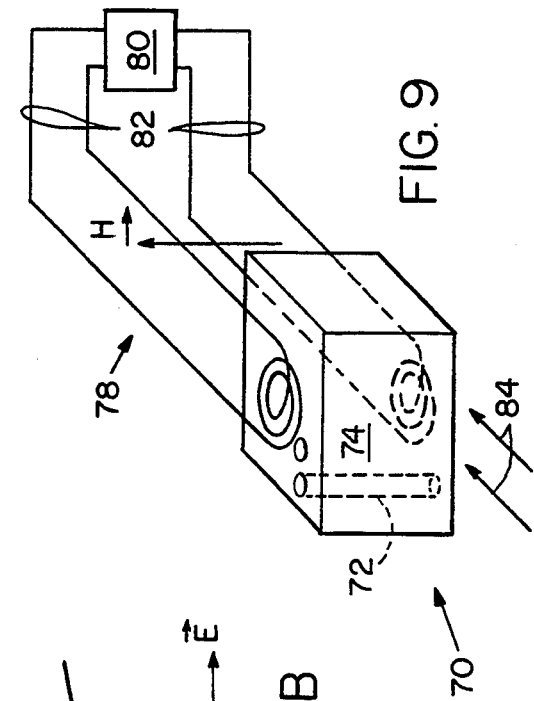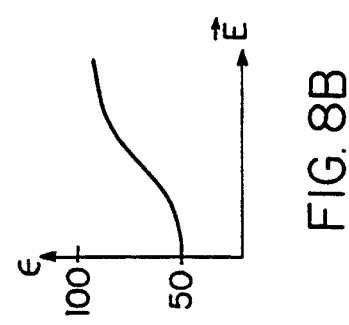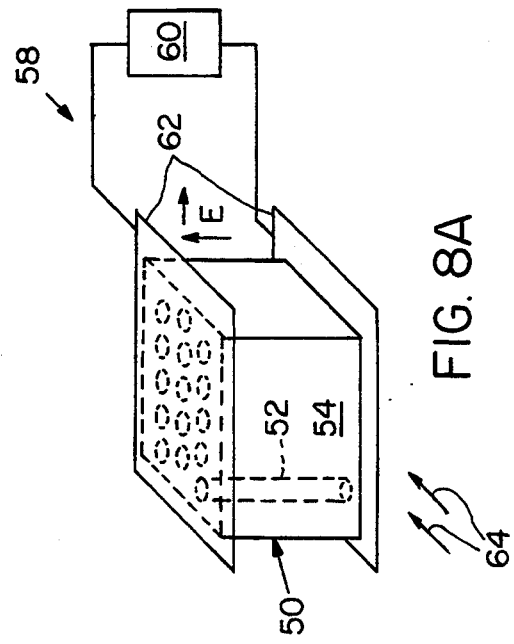

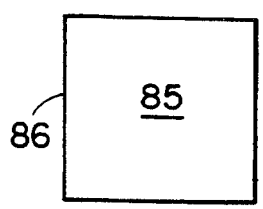
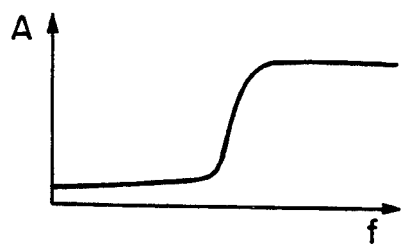
FIG. 10A  FIG. 10B
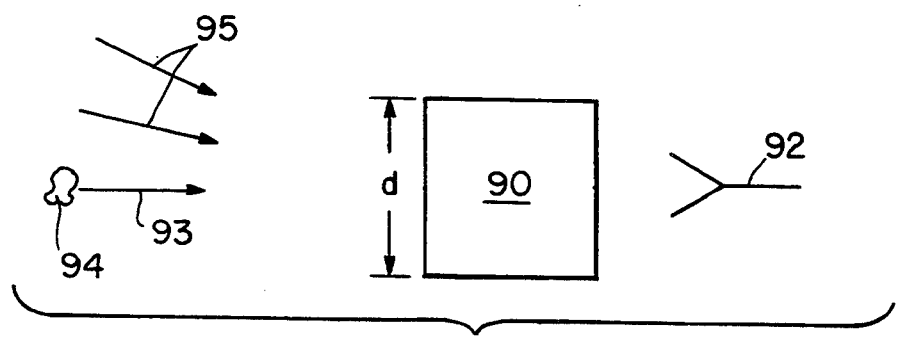
FIG. 11
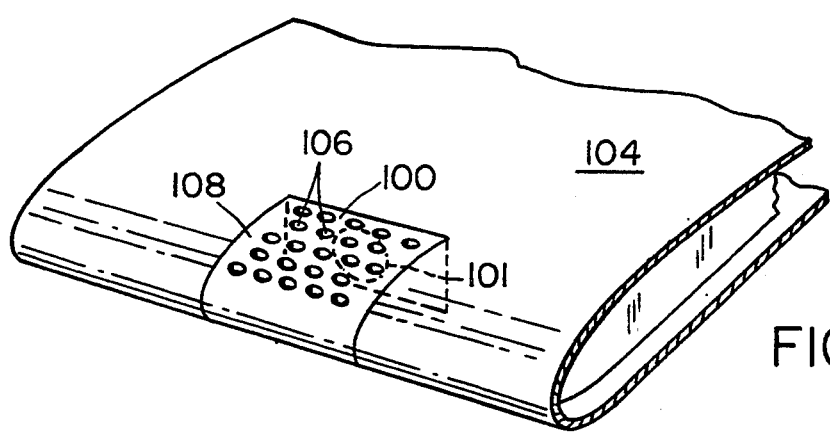
FIG. 12
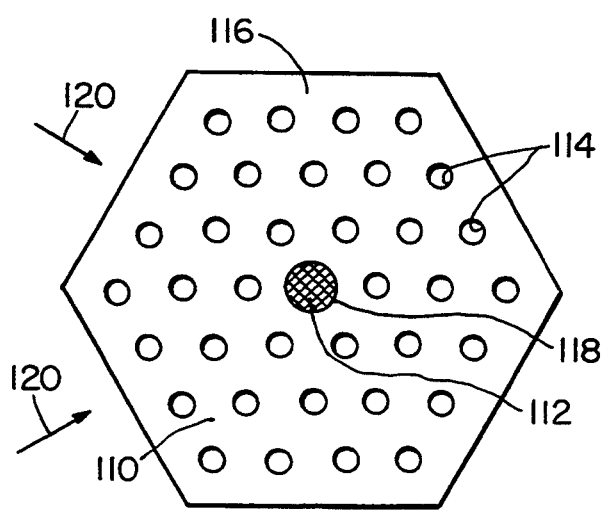
FIG. 13

FILTER UTILIZING A FREQUENCY SELECTIVE NON-CONDUCTIVE DIELECTRIC STRUCTURE

RELATED APPLICATIONS

This document is a Continuation-In-Part of Patent Cooperation Treaty Application, International Application No. PCT/US92/01228 filed Feb. 13, 1992 which is a continuation-in-part of U.S. patent application Ser. No. 07/656,812 filed Feb. 15, 1991, which issued on Feb. 16, 1993 as U.S. Pat. No. 5,187,461.

BACKGROUND

A considerable amount of research has been conducted in the study of surfaces which are selectively passive to the transmission and/or reception of electromagnetic energy. Such studies have resulted in the development of a wide variety of structures produced to solve various transmission and reception applications. For example, a frequency selective surface formed of a periodic array of conductors mounted on a flat surface such as a polyester film or other substrate is typically used as a filter for electromagnetic energy in the microwave to far infrared frequency bands.

SUMMARY OF THE INVENTION

A conventional frequency selective surface has a number of inherent limitations making it undesirable for various applications. One such application is use as a filter structure which conforms to a curved object. Bending a conventional frequency selective surface creates scattering points across the conductive array resulting in an overall degradation of filtering performance for the surface. Also, a conventional frequency selective surface is typically not tunable and hence cannot be used for tunable filter applications.

The present invention is directed to a filter utilizing a frequency-selective, non-conductive dielectric structure for filtering electromagnetic energy. The dielectric structure can be used to provide a band stop filter or a low pass filter in the microwave to ultraviolet frequency bands ($10^6$ to $10^{15}$ Hz). One advantage of the present invention is that the dielectric structure can be cut or machined into a variety of shapes or coated with another material without changing the stop band properties of the filter. Another advantage is that the dielectric structure maintains a substantially constant stop band for electromagnetic energy propagating at any incident angle in a plane transverse to an alignment axis of the structure.

In one embodiment, the dielectric filter structure comprises a non-conductive high-dielectric "background" material positioned to receive incident electromagnetic energy. In this embodiment, a lattice structure is formed of a plurality of non-conductive high-dielectric elements disposed in a two-dimensional periodic arrangement within the background material. The elements are preferably cylindrically shaped and arranged in a triangular lattice pattern. The elements extend in parallel to one another within the background material and reflect energy within a range of frequencies over a band gap. Thus, electromagnetic energy within the frequency range of the band gap is substantially prevented from propagating through the lattice structure. In other words, the dielectric structure operates as a band stop filter. The structure is most effective for blocking incoming electromagnetic energy propagating in a plane generally transverse to longitudinal axes extending through the elongated elements.

In another embodiment, a tunable filter is formed of a frequency-selective non-conductive dielectric structure for filtering incident electromagnetic energy in the microwave to ultraviolet frequency bands ($10^6$ to $10^{15}$ Hz). The tunable filter includes a non-conductive high-dielectric background material such as ferrite and/or ferroelectric material. A lattice structure comprised of a plurality of parallel elongated elements formed of a non-conductive high-dielectric material is disposed in a two-dimensional periodic arrangement within the background material. The elements extend through the background material and provide a frequency range (band gap) in which the electromagnetic energy within the frequency range is substantially prevented from propagating through the lattice structure. A signal source is positioned adjacent to the background material and provides an external field across the background material for tuning the frequency range of the band gap. By changing the magnitude of the external field, the band gap is electronically tuned for a given application.

The external field can be an electric field or a magnetic field. An external electric field changes the dielectric constant ($\epsilon$) of a dielectric material such as a ferroelectric material, while an external magnetic field changes the magnetic permeability ($\mu$) of a "magnetic" dielectric material such as a ferrite material. In either case, the applied external field alters ($\epsilon$) or ($\mu$) which changes the center frequency of the stop band resulting in a change in the location of the frequency range of the band gap.

The present invention also includes a method for fabricating a non-conductive dielectric filter structure. To that end, a plurality of layers or sheets of a substantially non-conductive high-dielectric material are provided. Next, cylindrical bores are formed through each sheet in a two-dimensional periodic arrangement such as a triangular lattice pattern. The bores can be formed through each sheet separately or the bores can be formed through a number of stacked sheets. The sheets are then stacked such that the bores in each sheet are aligned with the bores in adjacent sheets to form a plurality of cylindrical bores extending through opposite sides of the stack of sheets. The elongated bores are disposed in a triangular lattice pattern which extends in a plane orthogonal to the longitudinal axes of the bores. The bores can be filled with air or any other non-conductive, low-dielectric material.

The filter may be tuned in frequency by positioning a signal source adjacent to the stack of sheets. A non-linear dielectric material or magnetic material can be used such that the filter may be tuned in frequency. The signal Source provides an external field to tune the frequency range of the band gap. In either case, the filter structure can then be positioned to receive incoming electromagnetic energy.

Another method for fabricating a non-conductive, dielectric filter structure includes providing a block of non-conductive high-dielectric material. Cylindrical bores are drilled through the block in a two-dimensional periodic arrangement such as a triangular lattice pattern. The bores can be filled with air or any other non-conductive low-dielectric material. For a tunable filter, a signal source is positioned adjacent to the block for providing an external field to tune the frequency range of the band gap. The filter structure can then be positioned to receive incoming electromagnetic energy.

BRIEF DESCRIPTION OF THE DRAWINGS

In the enclosed drawings like reference characters refer to the same parts throughout the different views. The drawings are not necessarily to scale, emphasis instead being placed upon illustrating the principles of the present invention.

FIG. 4 is a graph showing the relationship between attenuation and frequency for the dielectric structure of FIG. 2.

FIG. 5 is a graph showing the relationship between band gap precentage and the radius of elongated elements for the dielectric structure of FIG. 2.

FIGS. 6A-6C is a perspective view flow sequence for a method of manufacturing a non-conductive dielectric filter structure.

FIGS. 7A and 7B are a perspective view flow sequence for another method of manufacturing a non-conductive dielectric filter structure.

FIG. 8A is a partial perspective view of a tunable filter employing a dielectric structure of the present invention.

FIG. 8B is a graph showing the relationship between the dielectric constant ($\epsilon$) of a ferroelectric background material used in the dielectric structure of FIG. 8A and electric field ($e$).

FIG. 9 is a partial perspective view of a tunable filter embodiment employing a dielectric structure with tunable magnetic permeability in accordance with the present invention.

FIG. 10A is an block diagram of a low pass filter utilizing a non-conductive dielectric structure of the present invention.

FIG. 10B is a graph showing the relationship between attenuation and frequency for the dielectric structure of FIG. 10A.

FIG. 11 is a block diagram of a band stop filter positioned adjacent to a sensor receiving electromagnetic energy signals from a target in the vicinity of interference signals.

FIG. 12 is a partial schematicized perspective view of a dielectric filter structure adapted to a conformal surface.

FIG. 13 is a partial schematicized plan view of a dielectric filter structure adapted to support an omnidirectional sensor.

DETAILED DESCRIPTION OF PREFERRED EMBODIMENTS

Figure 1:
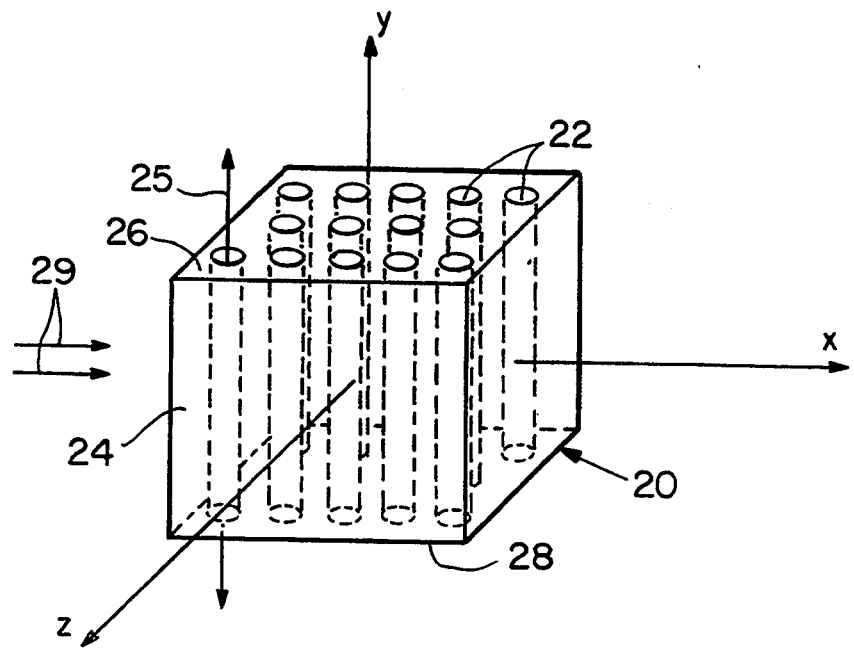
FIG. 1 is a perspective view illustrating a non-conductive dielectric filter structure embodying the principles of the invention.

A filter utilizing a frequency selective, non-conductive, dielectric structure 20 of the present invention is shown in FIG. 1. The structure 20 includes a plurality of elongated elements 22 formed of a non-conductive low-dielectric material and disposed within a non-conductive high-dielectric background material 24. It is noted that the term "elements" as used herein is intended to encompass, without limitation, bores or voids which may be filled with fluids or solids such as air and/or other liquid or solid material. The elements 22 extend in parallel to one another through opposite faces (26 and 28) of the background material 24. A longitudinal axis 25 extends through the center of each element 22 in the vertical or y-direction. The elements 22 are arranged periodically in two dimensions (x, z) in a plane generally orthogonal to the longitudinal axes 25 extending through the elements 22.

When employed as a filter, the structure 20 is positioned to receive incoming electromagnetic energy 29 and aligned relative to an alignment axis (the y-axis) which extends in parallel to the longitudinal axes 25 of the elements. In accordance with the present invention, the structure 20 reflects substantially all of the incident electromagnetic energy 28 within a frequency range producing a photonic frequency band gap. More specifically, incoming electromagnetic energy within the frequency range of the photonic band gap and propagating in a direction transverse to the longitudinal axes of the elements 22 is substantially prevented from propagating through the structure 20. In other words, the structure 20 operates as a band stop filter. The filter structure 20 is most effective for incoming electromagnetic energy propagating in a plane (or planes) generally parallel to the x-z plane and maintains a substantially constant band gap frequency range for energy directed along any incident angle in the plane.

Figure 2:
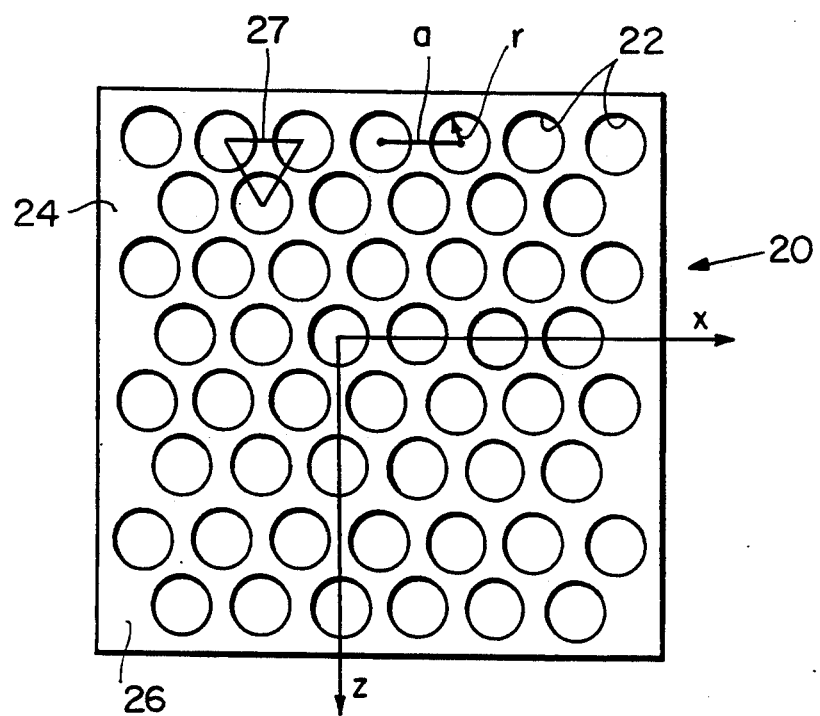
FIG. 2 is a plan view of the dielectric structure of FIG. 1 illustrating the two-dimensional periodic arrangement of elements in a background material.

Referring to FIG. 2, the elements 22 are cylindrically shaped and extending in a two-dimensional periodic arrangement relative to the x-z plane or any plane parallel thereto. Preferably, the cylindrical elements 22 are periodically arranged to provide a triangular lattice symmetry 27. The lines illustrate the triangular lattice arrangement of the cylindrical elements along the top face 26 of the background material 24. The cylindrical elements 22 can be simply regions of air or can include any other substantially non-conductive low-dielectric solid, fluid (liquid or gas) or gel material. Although cylindrical elements are described hereinafter, substantially cylindrical elements or any shaped elongated element may be employed without departing from the scope of the invention.

Any two-dimensional periodic structure has different transmissive properties for radiation polarized parallel (vertically) or perpendicular to (horizontally) the longitudinal axis of the structure. It is known in the art that many two-dimensional lattice geometries are capable of reflecting light waves over some frequency band for a single direction of polarization. See H. S. Bennet, Journal of Applied Physics, Vol. 24, page 785 (1953). However, the triangular lattice, structure 27 of the present invention reflects light waves from both directions of polarization over some frequency band. This capability is important when the structure 20 is positioned in front of a sensing element operating as a band stop filter (described in detail below). Without this capability, the structure would be an ineffective filter as the incident interference signals to be blocked may be of either polarization. With this capability, no polarization effects need to be taken into account in the coupling of electromagnetic energy to the filter structure 20.

Figure 3A:
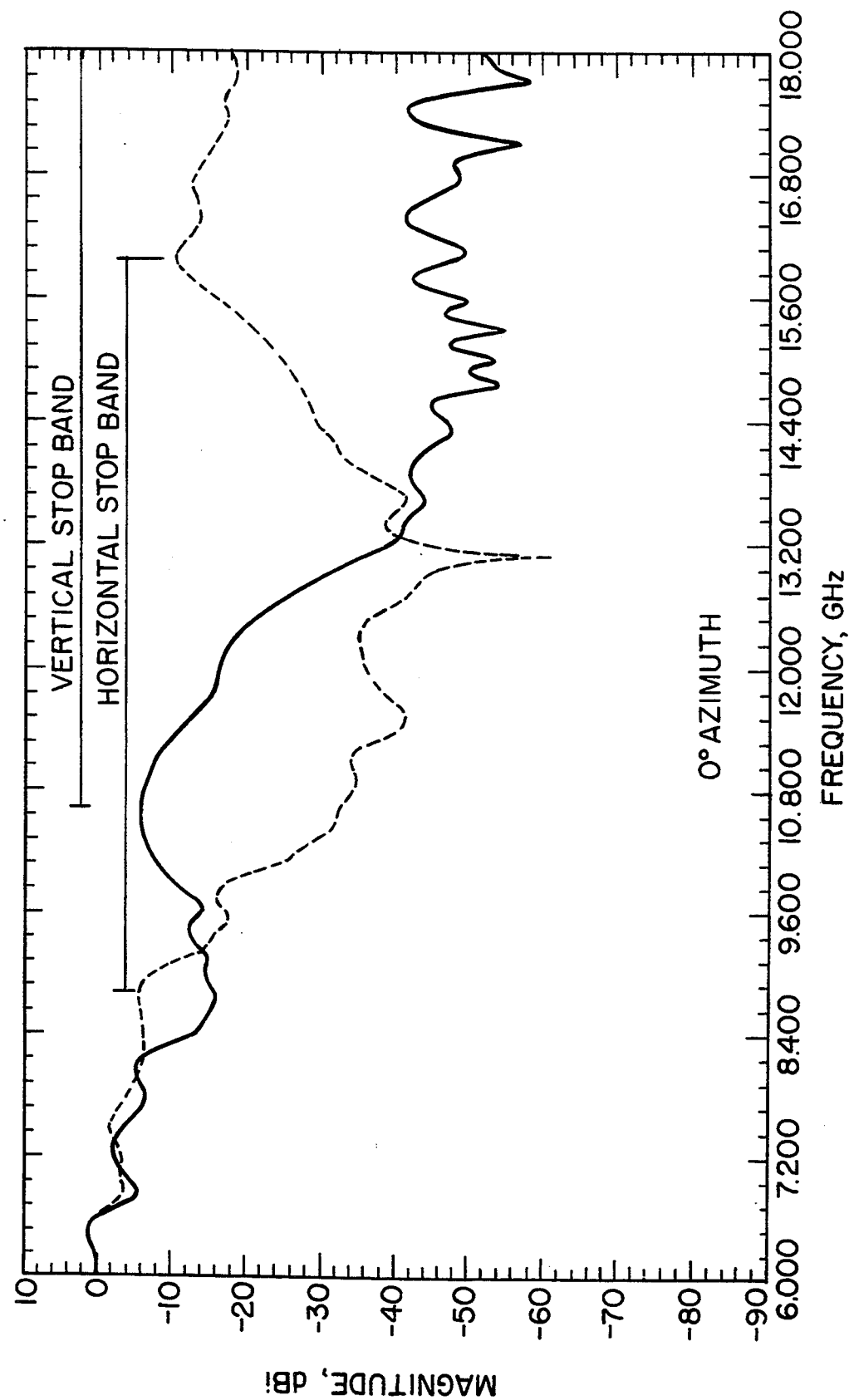
FIGS. 3A-3D are graphs illustrating the measured transmittance of the 13.2 GHz filter structure for radiation energy having azimuth angles of incidence ranging from zero to thirty degrees for horizontal and vertical polarization.
Figure 3B:
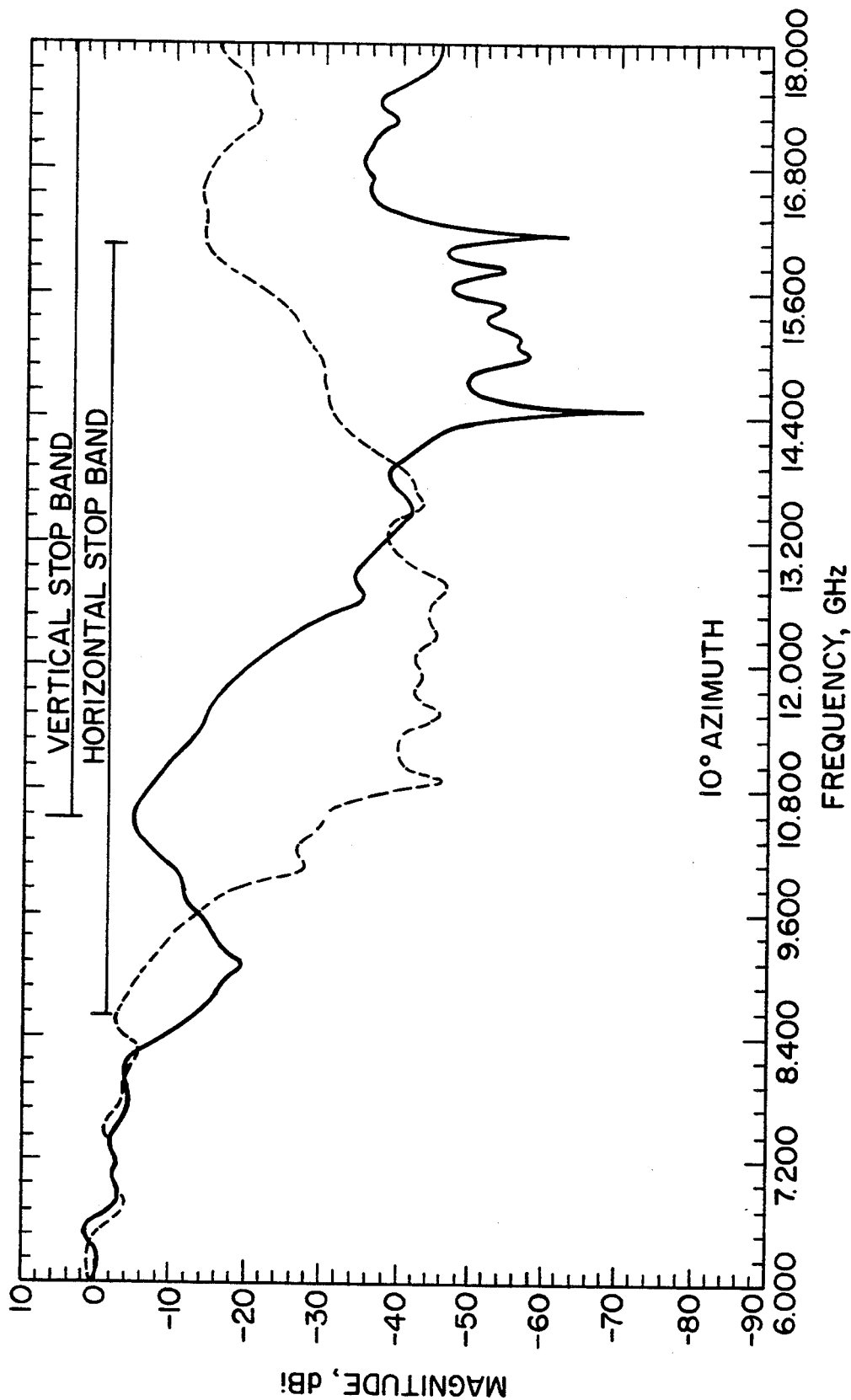
Figure 3C:
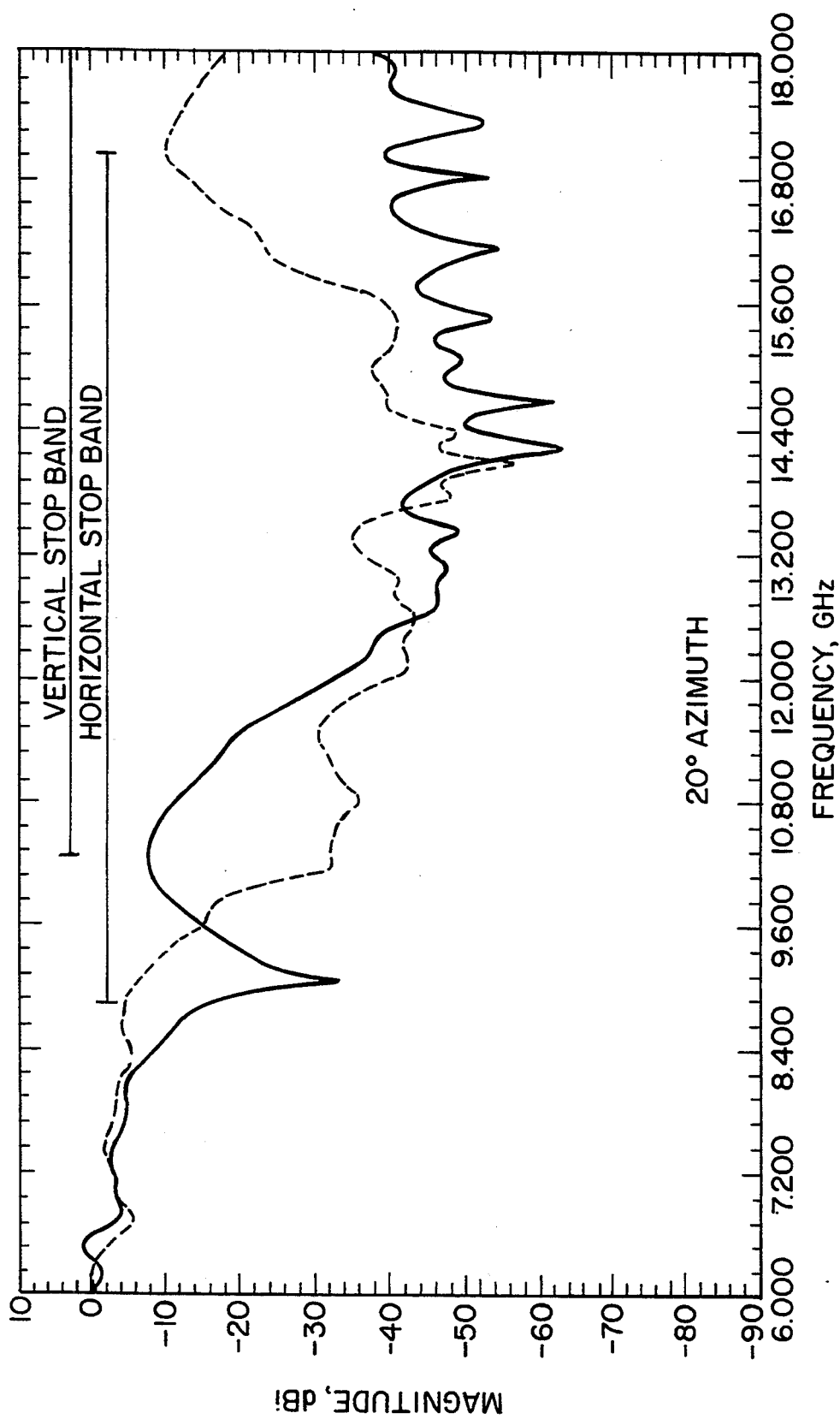
Figure 3D:
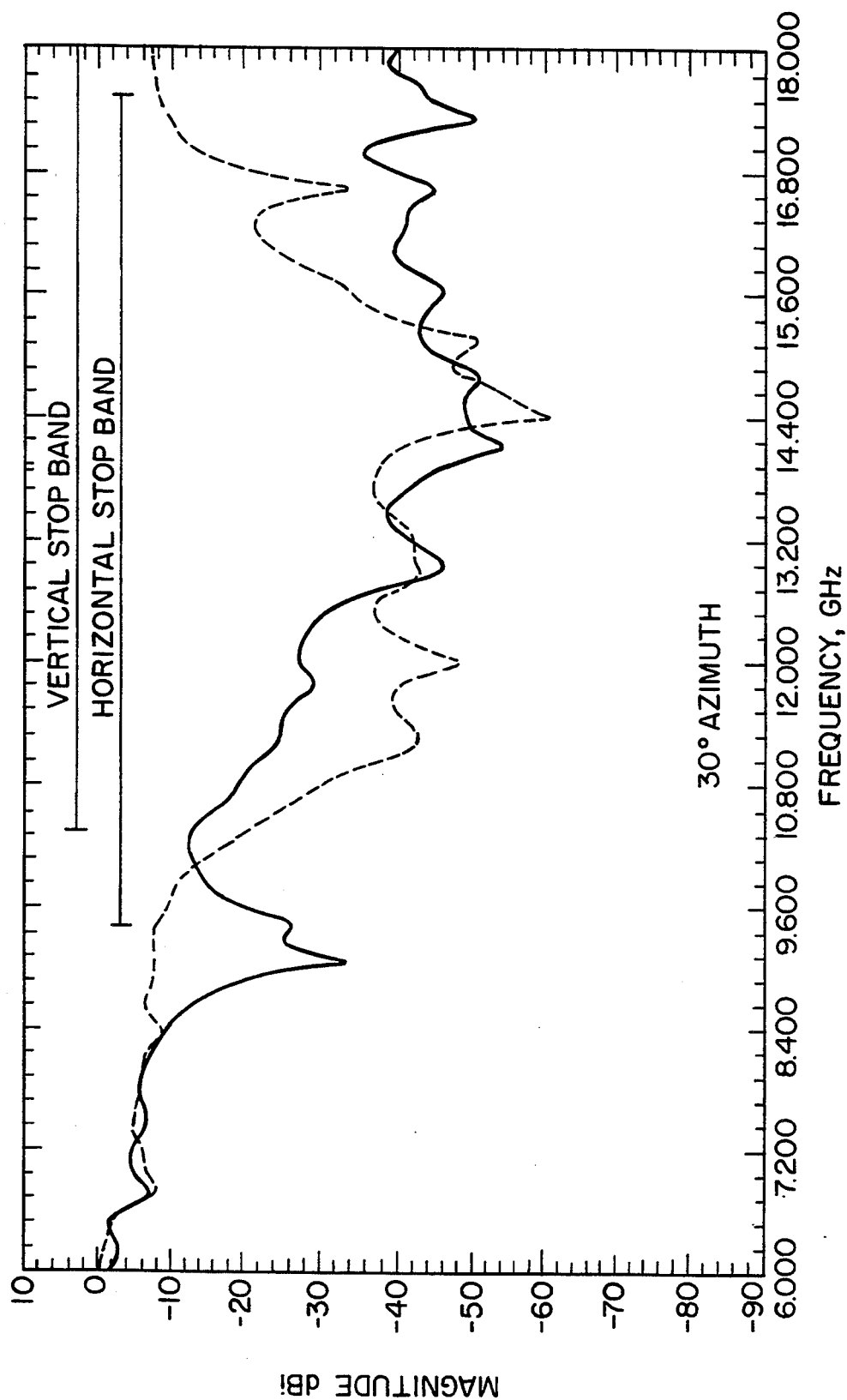

A filter structure having a stop band centered at 13.2 GHz was fabricated to demonstrate the feasibility of the present invention. Once fabricated, the band stop filter structure was positioned to receive eleotromagnetic radiation energy 29 (as shown in FIG. 1.). FIGS. 3A–3D show the measured transmittance of the 13.2 GHz filter for both orthogonal polarizations and for radiation energy having azimuth angles of incidence ranging from zero to thirty degrees. In each Figure, the transmittance measured for one polarization of energy 29 (see FIG. 1) is depicted by a solid line which indicates the vertical stop band. The measured transmittance for the other orthogonal polarization is depicted by a dashed line which indicates the vertical stop band. The stop band for the filter is the overlapping region of the vertical and horizontal stop bands. FIG. 3A shows the measured transmittance for the case in which the energy 29 (see FIG. 1) is incident on the filter structure 20 at a zero degree azimuth angle. FIGS. 3B, 3C and 3D illustrate the measurements for 10°, 20° and 30° azimuth angles, respectively. For the 13.2 GHz filter structure, the radiation energy about the center frequency of the stop band is attenuated by at least 40 dB relative to the passband for any angle of incidence.

One feature of the present invention is that the center frequency of the photonic band gap, the bandwidth of the photonic band gap (i.e. the stop band) and the band gap attenuation can be tailored for any frequency range in the microwave to ultraviolet bands ($10^6$ to $10^{15}$ Hz) during the fabrication of the filter structure. For the filter structure of FIG. 2, the center frequency (f), the bandwidth ($\Delta f$) and the band gap attenuation ($A_G$) of the photonic band gap are shown in FIG. 4. The attenuation ($A_G$) of the band gap is proportional to the number of rows of elements 22. Thus, the attenuation ($A_G$) can be increased by providing additional rows. The center frequency (f) of the bandwidth ($\Delta f$) can be computed in accordance with the following equation:

$$f=[13.8(13/\mu\epsilon)^{\frac{1}{2}}]/a \text{ GHz} \qquad \text{Equation 1.}$$

where $\epsilon$ = dielectric constant of background material,
$\mu$ = magnetic permeability of background material, and
$a$ = triangular lattice constant which corresponds to the distance in centimeters between centers of adjacent elements as shown in FIG. 2.

The location of the bandwidth on the frequency band is determined by the center frequency. However, the size of the bandwidth ($\Delta f$) is determined by the radius (r) of the cylindrical elements 22 and the triangular lattice constant (a) as shown in FIG. 2. FIG. 5 is a plot of the band gap percentage versus the radius (r) of the cylindrical elements. The band gap percentage is the ratio of the width of the band gap to the center frequency of the band gap. Referring to FIG. 5, the maximum bandwidth ($\Delta f$) is achieved when:

$$(r) = 0.475(a),$$

and the range of useful photonic bandwidths is generally limited to:

$$0.41(a) < (r) < 0.5(a).$$

A method for manufacturing a non-conductive dielectric filter structure is illustrated in FIGS. 6A–6C. Referring to FIG. 6A, a plurality of layers or sheets 30 of a substantially non-conductive high-dielectric material 32 are provided. Next, as shown in FIG. 6B, cylindrical bores 34 are formed through each sheet in a two-dimensional periodic arrangement such as a triangular lattice pattern 36. The bores 34 can be formed through each sheet 30 separately or the bores can be formed through a number of stacked sheets. The sheets 30 are then stacked such that the bores 34 in each sheet are aligned with the bores in adjacent sheets go form a plurality of parallel cylindrical bores 35 extending through opposite sides (38 and 40) of the stack of sheets 30 as shown in FIG. 6C. The elongated bores 35 are disposed in a triangular lattice pattern 36 in a plane orthogonal to the longitudinal axes of the bores (see FIG. 6B). The elongated bores 35 can be filled with air or any other non-conductive, low-dielectric material. The filter structure can then be positioned to receive incoming electromagnetic energy 39 as shown in FIG. 6C.

Another method for fabricating a non-conductive, dielectric filter structure is shown in FIGS. 7A and 7B. First, a block of non-conductive high-dielectric material 42 is provided (FIG. 7A). Cylindrical bores 44 are then drilled through the block 42 in a two-dimensional periodic arrangement such as a triangular lattice pattern 46 (FIG. 7B). The bores 44 can be filled with air or any other non-conductive low-dielectric material. The filter structure can then be positioned to receive incoming electromagnetic energy 48 (FIG. 7B).

Other embodiments of the present invention are directed to a tunable filter utilizing a frequency selective, non-conductive dielectric structure. In previously described embodiments, the dielectric constant ($\epsilon$) and the magnetic permeability ($\mu$) of the filter structure were constants. As such, the structure had a fixed stop band center frequency (f) in accordance with Equation (1). The fixed center frequency results in a fixed location of the stop band about that center frequency. However, the present invention also includes filter structure employing certain non-conductive, dielectric materials, such as ferrites and ferroelectrics, having indices of refraction which change under the application of an external field. The index of refraction for a particular material is related to its dielectric constant ($\epsilon$) and its magnetic permeability ($\mu$). An external electric field changes the dielectric constant ($\epsilon$) of a non-magnetic dielectric material such as a ferroelectric material, and an external magnetic field changes the magnetic permeability ($\mu$) of a magnetic dielectric material such as a ferrite material. In either case, the applied external field alters the index of refraction by changing ($\epsilon$) or ($\mu$) which changes the stop band center frequency (Equation (1)) and results in a change in the location of the stop band. By changing the magnitude of the applied external field, one can electronically tune the location of the stop band for a given application.

One embodiment of a tunable filter of the present invention is illustrated in FIG. 8A. The filter includes a non-conductive dielectric structure 50 fabricated in accordance with any of the previously described methods. The structure 50 comprises a plurality of elongated parallel elements 52 formed of a non-conductive low-dielectric material and disposed within a non-conductive high-dielectric ferroelectric material 54 such as $BaSnTiO_3$. The elements 52 extend through opposite faces of the ferroelectric material 54 and are disposed in a triangular lattice pattern in a plane generally orthogonal to a longitudinal axis of each element.

A signal source 58 is positioned adjacent to the structure 50. The source 58 includes a voltage supply 60 and a pair of conducting plates 62 positioned adjacent to the top and bottom of the structure 50. The plates 62 are connected to the voltage supply 60 for producing an electric field (E) across the structure 50.

The dielectric constant E for the BaSnTiO3 material increases for an increasing applied electric field E as shown in FIG. 8B. In accordance with the present invention, the structure 50 reflects substantially all of the incident electromagnetic energy 64 within a tunable stop band frequency range having a center frequency (f). With reference to FIG. 8B and Equation (1), increasing the dielectric constant by increasing the applied electric field (E) lowers the stop band center frequency (f) and thus lowers the location of the stop band frequency range. Conversely, lowering the dielectric constant by reducing the applied electric field (E) raises the stop band center frequency (f) and thus raises the location of the stop band.

Another embodiment of a tunable filter of the present invention is illustrated in FIG. 9. The filter includes a non-conductive dielectric structure 70 fabricated in accordance with any of the previously described methods. The structure 70 comprises a plurality of elongated, parallel elements 72 formed of a non-conductive low-dielectric material and disposed within a non-conductive high-dielectric ferrite material 74. The elements 72 extend through opposite faces of the ferrite material 74 and are disposed in a triangular lattice pattern in a plane generally orthogonal to a longitudinal axis of each element.

A signal source 78 is positioned adjacent to the structure 70. The source 78 includes a current supply 80 and a pair of coils 82 positioned adjacent to the top and bottom of the structure 70. The coils 82 are connected to the current supply 80 for producing a magnetic field (H) across the structure 70. The magnetic permeability for the ferrite material changes with the applied magnetic field such that the stop band is tunable. As such, the structure 70 reflects substantially all of the incident electromagnetic energy 84 within a tunable stop band frequency range having a tunable center frequency (f).

Although the previously described embodiments are generally directed to a band stop filter, a frequency selective, non-conductive, dielectric structure can also be employed as a low pass filter as shown in FIGS. 10A and 10B. Referring to FIG. 10A, the background material 85 of the dielectric structure 86 (fabricated in accordance with any previously described method) is disordered on a scale slightly smaller than the desired stop band wavelength. As such, the structure scatters all high frequency electromagnetic energy acting as a low pass filter. The low pass frequency characteristic is shown in FIG. 10B.

A filter utilizing a frequency selective, non-conductive, dielectric structure of the previously described embodiments can be employed in a variety of submillimeter to far infrared frequency band applications. In one generic application illustrated in FIG. 11, the filter 90 is positioned in front of a sensor 92 receiving electromagnetic energy signals 93 from a weak target 94 in the vicinity of strong interference signals 95. Regardless of their polarization and orientation, the filter 90 substantially reflects the interference signals 95 with negligible insertion loss on the desired signals 93. By increasing the thickness (d) of the filter and the number of elongated elements (not shown), the rejection of the interference signals can exceed 100 dB with increasing the insertion loss appreciably.

Referring to FIG. 12, in another application of the present invention a filter structure 100 is adapted to conform to a curved surface of a vehicle or platform 104. The filter 100 is positioned in front of a sensor 101 (shown in dotted lines) mounted within the vehicle or platform for receiving electromagnetic energy from radiating sources. The filter 100 is formed of a two-dimensional periodic array of elongated non-conductive low-dielectric elements 106 disposed in a non-conductive high-dielectric background material 108. Excess background material 108 around the edges of the structure 100 does not adversely affect the stop band characteristics. Thus, the background material 108 can be cut or machined into a variety of shapes or coated with another material without changing the stop band properties of the filter structure 100. However, the background material should be formed of several layers of sheets to achieve sufficient attenuation in the stop band. Generally, the thicker the bulk material, the greater the attenuation in the stop band.

Referring to FIG. 13, in another application, a filter structure 110 can be formed to support an omnidirectional sensor 112. The hexagonal-shaped filter 110 includes a two-dimensional periodic array of elongated, non-conductive, low-dielectric elements 114 disposed in a non-conductive, high-dielectric, background material 116. The sensor 112 is positioned in a bore 118 formed in the center of the structure 110. The filter substantially reflects interfering signals such that the sensor 112 can receive electromagnetic energy 120 from targets.

It has been noted that the filter structures of the present invention can be employed in a wide range of frequency bands governed by the diameter of the elements formed in the dielectric structure. Microfabrication techniques allow for the formation of elements on the order of about 500 angstroms in diameter. To that end, a UV band stop filter can be constructed by forming two-dimensional periodic bores with 500 angstrom diameter in a semiconductor background material in accordance with any of the aforementioned fabrication methods. The filter would be capable of blocking strong UV radiation from an undesirable source such as the sun allowing an adjacent sensor to detect UV radiation from a different source.

EQUIVALENTS

While this invention has been particularly shown and described with reference to preferred embodiments thereof, it will be understood by those skilled in the art that various changes in form and detail may be made therein without departing from the spirit and scope of the invention as defined by the appended claims.

We claim:
1. A filter comprising:
   a first non-conductive dielectric material for receiving electromagnetic energy; and
   a spatially periodic dielectric lattice structure comprised of a plurality of elongated elements of a second non-conductive dielectric material, the elongated elements extending in parallel to each other along parallel longitudinal axes of the elongated elements and being disposed with respect to a plane orthogonal to the longitudinal axes of the elongated elements in a two-dimensional periodic lattice arrangement within the first non-conductive dielectric material, the lattice structure having dimensions which are proportioned such that the structure defines a band gap at a range of electro- magnetic energy frequencies such that electromagnetic energy at such frequencies having a polarization parallel to the longitudinal axis of the elongated elements and electromagnetic energy at such frequencies having a polarization perpendicular to the longitudinal axis of the elongated elements is substantially prevented from propagating within the spatially periodic dielectric lattice structure.

2. A filter as claimed in claim 1 wherein the two-dimensional periodic lattice arrangement is a triangular arrangement.

3. A filter as claimed in claim 1 wherein the second non-conductive dielectric material comprises air.

4. A filter as claimed in claim 1 wherein the elements have a cylindrical configuration.

5. A filter as claimed in claim 1 wherein the first non-conductive dielectric material is a high-dielectric-constant material and the second non-conductive dielectric material is a low-dielectric-constant material.

6. A filter as claimed in claim 1 wherein the frequency range of the band gap is within $10^6$ to $10^{15}$ Hz.

7. A filter as claimed in claim 1 further comprising a tuning circuit coupled to the first non-conductive dielectric material for changing a characteristic of the first non-conductive dielectric material such that the frequency range of the band gap is tunable.

8. A filter as claimed in claim 1 further comprising a signal source coupled across the first non-conductive dielectric material for providing an external field across the first material, the external field changing a characteristic of the first non-conductive dielectric material to tune the frequency range of the band gap.

9. A filter as claimed in claim 8 wherein the first non-conductive dielectric material comprises a ferroelectric material, said characteristic is defined by a dielectric constant of the first non-conductive dielectric material, and the external field is an electric field which changes the dielectric constant of the first non-conductive dielectric material.

10. A filter as claimed in claim 8 wherein the first non-conductive dielectric material comprises a ferrite material, said characteristic is defined by a magnetic permeability of the first non-conductive dielectric material, and the external field is a magnetic field which changes the magnetic permeability of the first non-conductive dielectric material.

11. A filter as claimed in claim 1 wherein the first non-conductive dielectric material is oriented to receive electromagnetic energy propagating in a direction transverse to the longitudinal axes of the parallel elongated elements.

12. A filter as claimed in claim 1 wherein the filter maintains a substantially constant band gap frequency range for electromagnetic energy propagating at any incident angle in the plane orthogonal to the longitudinal axes of the parallel elongated elements.

13. A filter as claimed in claim 1 wherein the band gap defines a stop band for the filter.

14. A filter as claimed in claim 1 further comprising a tuning circuit coupled to the first non-conductive dielectric material for changing a characteristic of the second non-conductive dielectric material such that the frequency range of the band gap is tunable.

15. A band stop filter comprising:
a non-conductive high-dielectric-constant material for receiving electromagnetic energy; and
a spatially periodic dielectric lattice structure comprised of a plurality of elongated elements of a non-conductive low-dielectric-constant material, the elongated elements extending in parallel to each other along parallel longitudinal axes of the elongated elements through the non-conductive high-dielectric-constant material and being disposed with respect to a plane orthogonal to the longitudinal axes of the elongated elements in a two-dimensional period lattice arrangement within the non-conductive high-dielectric-constant material and extending through the non-conductive high-dielectric-constant material in a direction transverse to a direction of propagation of the electromagnetic energy, the lattice structure having dimensions which are proportioned such that the lattice structure defines a stop band at a range of electromagnetic energy frequencies such that electromagnetic energy at such frequencies having a polarization parallel to the longitudinal axis of the elongated elements and electromagnetic energy at such frequencies having a polarization perpendicular to the longitudinal axis of the elongated elements is substantially prevented from propagating within the spatially periodic dielectric lattice structure.

16. A band stop filter as claimed in claim 15 wherein the non-conductive low-dielectric-constant material comprises air.

17. A band stop filter as claimed in claim 15 wherein the non-conductive high-dielectric-constant material has a dielectric constant of at least 10.

18. A band stop filter as claimed in claim 15 further comprising a signal source coupled across the non-conductive high-dielectric-constant material for providing an external field across the non-conductive high-dielectric-constant material, the external field changing a characteristic of the non-conductive high-dielectric-constant material to tune the frequency range of the stop band.

19. A band stop filter as claimed in claim 18 wherein the non-conductive high-dielectric-constant material comprises a ferroelectric material, said characteristic is defined by a dielectric constant of the first non-conductive dielectric material, and the external field is an electric field which changes the dielectric constant of the non-conductive high-dielectric-constant material.

20. A band stop filter as claimed in claim 18 wherein the non-conductive high-dielectric-constant material comprises a ferrite material, said characteristic is defined by a magnetic permeability of the first non-conductive dielectric material, and the external field is a magnetic field which changes the magnetic permeability of the non-conductive high-dielectric-constant material.

21. A band stop filter as claimed in claim 15 wherein the filter maintains a substantially constant stop band frequency range for electromagnetic energy propagating at any incident angle in the plane orthogonal to the longitudinal axes of the parallel elongated elements.

22. A band stop filter as claimed in claim 15 wherein the two-dimensional periodic lattice arrangement is a triangular arrangement.

23. A tunable filter comprising:
a first non-conductive dielectric material for receiving electromagnetic energy;
a spatially periodic dielectric lattice structure comprised of a plurality of elongated elements of a second non-conductive dielectric material, the elongated elements extending in parallel to each other along parallel longitudinal axes of the elongated elements and being disposed with respect to a plane orthogonal to the longitudinal axes of the elongated elements in a two-dimensional periodic lattice arrangement within the first non-conductive dielectric material, the lattice structure having dimensions which are proportioned such that the lattice structure defines a band gap at a range of electromagnetic energy frequencies such that electromagnetic energy at such frequencies having a polarization parallel to the longitudinal axis of the elongated elements and electromagnetic energy at such frequencies having a polarization perpendicular to the longitudinal axis of the elongated elements is substantially prevented from propagating within the spatially periodic dielectric lattice structure; and a signal source coupled across the first non-conductive dielectric material for providing an external field across the first non-conductive dielectric material, the external field changing a characteristic of the first non-conductive dielectric material to tune the frequency range of the band gap.

24. A filter as claimed in claim 23 wherein the elongated elements are cylindrical rods.

25. A filter as claimed in claim 23 wherein the first non-conductive dielectric material is high-dielectric-constant material and the second non-conductive dielectric material is a low-dielectric-constant material.

26. A filter as claimed in claim 25 wherein the second non-conductive dielectric material comprises air.

27. A filter as claimed in claim 23 wherein the frequency of the band gap is within $10^6$ to $10^{15}$ Hz.

28. A filter as claimed in claim 23 wherein the first non-conductive dielectric material comprises a ferroelectric material, said characteristic is defined by a dielectric constant of the first non-conductive dielectric material, and the external field is an electric field which changes the dielectric constant of the first non-conductive dielectric material.

29. A filter as claimed in claim 28 wherein the signal source comprises:

a voltage supply; and a pair of conducting plates electrically connected to the voltage supply, one of the conducting plates being attached to a first side of the first non-conductive dielectric material and the other conducting plate being attached to a second side of the first non-conductive dielectric material opposite the first side of the non-conductive dielectric material, the pair of conducting plates providing the external electric field across the first non-conductive dielectric material.

30. A filter as claimed in claim 23 wherein the first non-conductive dielectric material comprises a ferrite material, said characteristic is defined by a magnetic permeability of the first non-conductive dielectric material, and the external field is a magnetic field which changes the magnetic permeability of the first non-conductive dielectric material.

31. A filter as claimed in claim 30 wherein the signal source comprises:

a current supply; and a pair of coils electrically connected to the current supply, one of the coils being attached to a first side of the first non-conductive dielectric material and the other coil being attached to a second side of the first non-conductive dielectric material opposite the first side of the first non-conductive dielectric material, the pair of coils providing the external magnetic field across the first non-conductive dielectric material.

32. A filter as claimed in claim 23 wherein the first non-conductive dielectric material is positioned to receive electromagnetic energy propagating in a direction transverse to the longitudinal axes of the parallel elongated elements.

33. A filter as claimed in claim 23 wherein the filter maintains a substantially constant band gap frequency range for electromagnetic energy propagating at any incident angle in the plane orthogonal to the longitudinal axes of the parallel elongated elements.

34. A filter as claimed in claim 23 wherein the band gap defines a stop band for the filter.

35. A filter as claimed in claim 23 wherein the first non-conductive dielectric material has at least one curved surface.

36. A filter as claimed in claim 23 wherein the two-dimensional periodic lattice arrangement is a triangular arrangement.

37. An electromagnetic energy filter comprising:

A body of non-conductive dielectric material; and a spatially periodic dielectric lattice structure in said body and comprised of a plurality of elongated non-conductive dielectric elements disposed with respect to a plane orthogonal to a longitudinal axis of the elongated elements in a two-dimensional periodic lattice arrangement within the body and extending in parallel with one another through the body, the lattice structure having dimensions which are proportioned such that the lattice structure defines a band gap at a range of electromagnetic energy frequencies such that electromagnetic energy at such frequencies having a polarization parallel to the longitudinal axis of the elongated elements and electromagnetic energy at such frequencies having a polarization perpendicular to the longitudinal axis of the elongated elements which is incident on the body of non-conductive dielectric material is substantially prevented from propagating within the body of non-conductive dielectric material.

38. A filter as claimed in claim 37 wherein the two-dimensional periodic lattice arrangement is a triangular arrangement.

39. A filter as claimed in claim 37 wherein the band gap defines a stop band for the filter.

* * * * *